US012581914B2

(12) United States Patent
　Miller

(10) Patent No.: US 12,581,914 B2
(45) Date of Patent: Mar. 17, 2026

(54) OPTICAL METROLOGY WITH NUISANCE FEATURE MITIGATION

(71) Applicant: Onto Innovation Inc., Wilmington, MA (US)

(72) Inventor: Jonathan Andrew Miller, Fremont, CA (US)

(73) Assignee: Onto Innovation Inc., Wilmington, MA (US)

( * ) Notice: Subject to any disclaimer, the term of this patent is extended or adjusted under 35 U.S.C. 154(b) by 945 days.

(21) Appl. No.: 17/836,933

(22) Filed: Jun. 9, 2022

(65) Prior Publication Data

US 2023/0402328 A1　Dec. 14, 2023

(51) Int. Cl.
*H01L 21/66* (2006.01)
*G01N 21/21* (2006.01)
*G01N 21/45* (2006.01)
*G01N 21/35* (2014.01)

(52) U.S. Cl.
CPC ............ *H01L 22/12* (2013.01); *G01N 21/211* (2013.01); *G01N 21/45* (2013.01); *G01N 2021/3595* (2013.01)

(58) Field of Classification Search
CPC ....... H01L 22/12; H01L 22/20; G01N 21/211; G01N 21/45; G01N 2021/3595; G01N 2021/213; G01N 2201/1296
See application file for complete search history.

(56) References Cited

U.S. PATENT DOCUMENTS

| | | | |
|---|---|---|---|
| 7,567,351 B2 | 7/2009 | Opsal et al. | |
| 8,577,820 B2 | 11/2013 | Jin et al. | |
| 9,310,296 B2 | 4/2016 | Dziura et al. | |
| 10,769,320 B2 | 9/2020 | Kuznetsov et al. | |
| 2013/0304683 A1 | 11/2013 | Lo | |
| 2016/0162779 A1 | 6/2016 | Marcus et al. | |
| 2018/0075581 A1 | 3/2018 | Shi et al. | |

(Continued)

FOREIGN PATENT DOCUMENTS

| | | |
|---|---|---|
| KR | 10-2022-0044744 A | 4/2022 |
| TW | 201833539 A | 9/2018 |

(Continued)

OTHER PUBLICATIONS

Ganin, Yaroslav, "Domain-Adversarial Training of Neural Networks," Journal of Machine Learning Research 17, Apr. 2016, pp. 1-35, 15-239.pdf (mit.edu).

(Continued)

*Primary Examiner* — Su C Kim
(74) *Attorney, Agent, or Firm* — Paradice & Li LLP

(57) ABSTRACT

A sample that includes a target structure with a structure-of-interest (SOI) having a set of known parameters optically coupled to an unknown structure, e.g., having unknown parameters, is optically measured using light that is incident on the target structure. Light detected from the target structure in response to the incident illumination light incident is used to obtain metrology data, which is a combination of a from the SOI and a contribution from the unknown structure. A set of parameter values characterizing the SOI and a set of parameter values characterizing the unknown structure are determined from a trained neural network based on the metrology data.

22 Claims, 4 Drawing Sheets

(56)              References Cited

U.S. PATENT DOCUMENTS

| | | | |
|---|---|---|---|
| 2018/0149603 | A1 | 5/2018 | Bhattacharyya et al. |
| 2020/0134455 | A1 | 4/2020 | Choi et al. |
| 2020/0143528 | A1 | 5/2020 | Kulkarni et al. |
| 2020/0167914 | A1 | 5/2020 | Stamatoyannopoulos et al. |
| 2020/0170553 | A1 | 6/2020 | Kasahara et al. |
| 2020/0226742 | A1 | 7/2020 | Sawlani et al. |
| 2022/0056584 | A1* | 2/2022 | Agarwal .............. B23K 31/003 |
| 2022/0269184 | A1* | 8/2022 | Lin ................... G03F 7/706841 |
| 2022/0291136 | A1 | 9/2022 | Mizumura |
| 2022/0310425 | A1* | 9/2022 | Ng ......................... G01B 11/06 |

FOREIGN PATENT DOCUMENTS

| | | | |
|---|---|---|---|
| TW | 202030557 | A | 8/2020 |
| WO | WO 2020/092856 | A1 | 5/2020 |

OTHER PUBLICATIONS

Perdue, G.N., "Reducing model bias in a deep learning classifier using domain adversarial neural networks in the MINERvA experiment," Journal of Instrumentation, vol. 13, Nov. 27, 2018, https://arxiv.org/abs/1808.08332.

International Preliminary Report on Patentability dated Dec. 19, 2024, in PCT Application No. PCT/US2023/023595, Filed May 15, 2023.

International Search Report and Written Opinion dated Sep. 14, 2023, for PCT application No. PCT/US2023/023595, filed May 25, 2023.

* cited by examiner

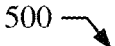

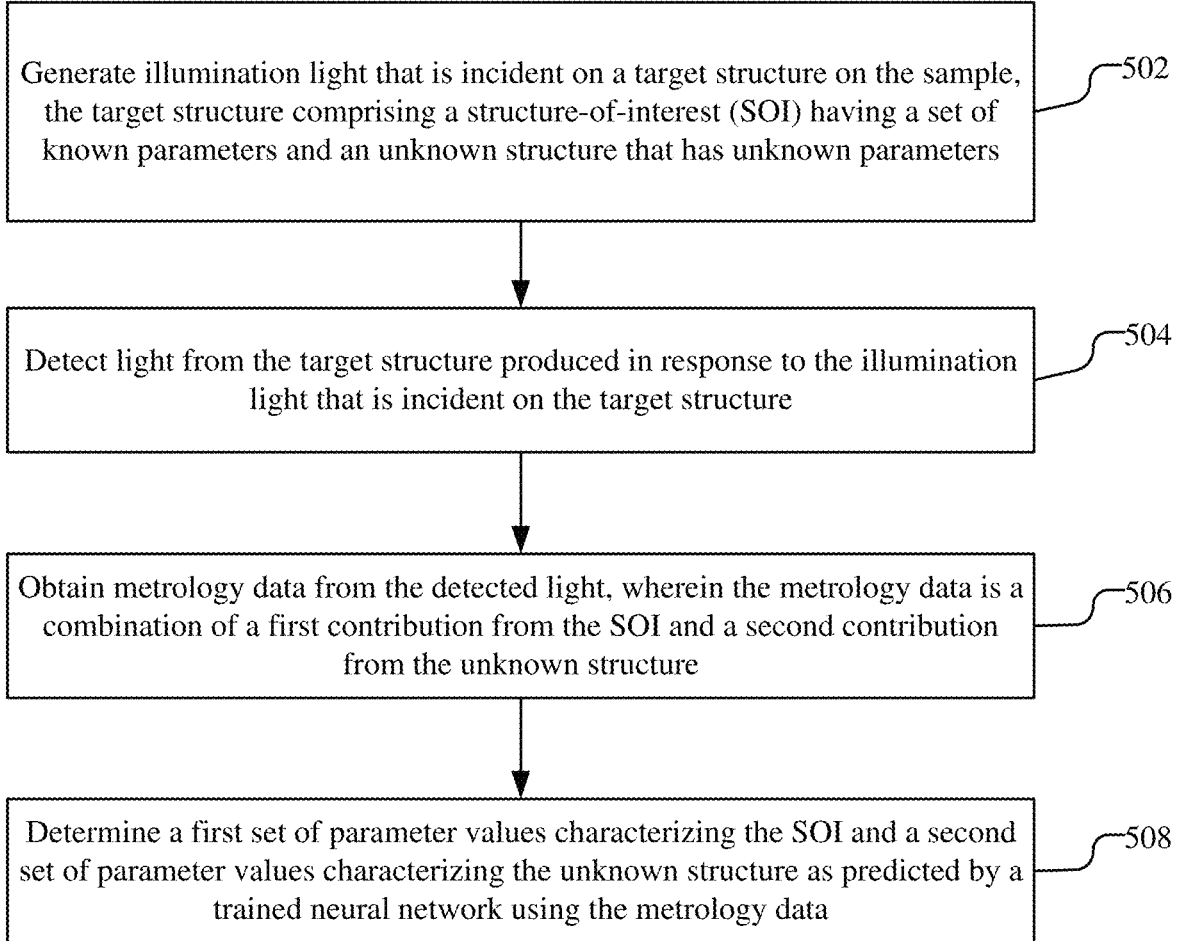

Generate illumination light that is incident on a target structure on the sample, the target structure comprising a structure-of-interest (SOI) having a set of known parameters and an unknown structure that has unknown parameters ⟶502

Detect light from the target structure produced in response to the illumination light that is incident on the target structure ⟶504

Obtain metrology data from the detected light, wherein the metrology data is a combination of a first contribution from the SOI and a second contribution from the unknown structure ⟶506

Determine a first set of parameter values characterizing the SOI and a second set of parameter values characterizing the unknown structure as predicted by a trained neural network using the metrology data ⟶508

Fig. 5

OPTICAL METROLOGY WITH NUISANCE FEATURE MITIGATION

FIELD OF THE DISCLOSURE

Embodiments of the subject matter described herein are related generally to optical metrology, and more particularly to modeling and measuring structures that include unknown sections.

BACKGROUND

Semiconductor and other similar industries often use optical metrology equipment to provide non-contact evaluation of samples during processing. With optical metrology, a sample under test is illuminated with light, e.g., at a single wavelength or multiple wavelengths. After interacting with the sample, the resulting light is detected and analyzed to determine one or more characteristics of the sample.

The analysis typically includes a model of the structure under test. The model may be generated based on the materials and the nominal parameters of the structure, e.g., film thicknesses, line and space widths, etc. One or more parameters of the model may be varied and the predicted data may be calculated for each parameter variation based on the model, e.g., using Rigorous Coupled Wave Analysis (RCWA) or other similar techniques. The measured data may be compared to the predicted data for each parameter variation, e.g., in a nonlinear regression process, until a good fit is achieved between the predicted data and the measured data, at which time the fitted parameters are determined to be an accurate representation of the parameters of the structure under test.

Modeling techniques are particularly useful when the sample has periodic structure. Unfortunately, when the sample includes sections that are non-periodic, analytically modeling the sample can be difficult. Moreover, if the sample includes one or more sections with unknown design and/or characteristics, i.e., preliminary structural information for one or more sections is unknown or unavailable, building a rigorous model for the sample is not possible. Therefore, what is needed is an improved optical metrology process that can be used to measure sample structures that include unknown and/or non-periodic sections.

SUMMARY

A sample that includes a target structure with a structure-of-interest (SOI) having a set of known parameters optically coupled to an unknown structure, e.g., having unknown parameters, may be measured using an optical metrology device. Illumination light is generated that is incident on the target structure and light from the target structure in response to the incident light is detected. Metrology data is obtained based on the detected light, which is a combination of a contribution from the SOI and a contribution from the unknown structure. A set of parameter values characterizing the SOI and a set of parameter values characterizing the unknown structure are determined from a trained neural network based on the metrology data.

In one implementation, a method of optical measurement of a sample includes generating illumination light that is incident on a target structure on the sample, the target structure comprising a structure-of-interest (SOI) having a set of known parameters and an unknown structure that has unknown parameters. Light from the target structure produced in response to the illumination light incident on the target structure is detected. Metrology data from the detected light is obtained. The metrology data is a combination of a first contribution from the SOI and a second contribution from the unknown structure. A first set of parameter values characterizing the SOI and a second set of parameter values characterizing the unknown structure are determined as predicted by a trained neural network using the metrology data.

In one implementation, an optical metrology device configured for optical measurement of a sample includes a light source configured to generate light to be incident on a target structure on the sample, the target structure comprising a structure-of-interest (SOI) having a set of known parameters and an unknown structure that has unknown parameters. The optical metrology device further includes a detector configured to detect light from the target structure produced in response to the light that is incident on the target structure. The optical metrology device further includes at least one processor coupled to the at least one detector. The at least one processor is configured to obtain metrology data from the detected light, wherein the metrology data is a combination of a first contribution from the SOI and a second contribution from the unknown structure. The at least one processor is further configured to determine a first set of parameter values characterizing the SOI and a second set of parameter values characterizing the unknown structure as predicted by a trained neural network using the metrology data.

In one implementation, an optical metrology device configured for optical measurement of a sample includes a light source configured to generate light to be incident on a target structure on the sample, the target structure comprising a structure-of-interest (SOI) having a set of known parameters and an unknown structure that has unknown parameters. The optical metrology device further includes a detector configured to detect light from the target structure produced in response to the light that is incident on the target structure. The optical metrology device further includes a means for obtaining metrology data from the detected light, wherein the metrology data is a combination of a first contribution from the SOI and a second contribution from the unknown structure. The optical metrology device further includes a means for determining a first set of parameter values characterizing the SOI and a second set of parameter values characterizing the unknown structure as predicted by a trained neural network using the metrology data.

BRIEF DESCRIPTION OF THE DRAWINGS

FIG. 5 is a flow chart illustrating a method of measuring a target structure including an SOI and unknown structuring using a trained neural network.

DETAILED DESCRIPTION

Figure 1:
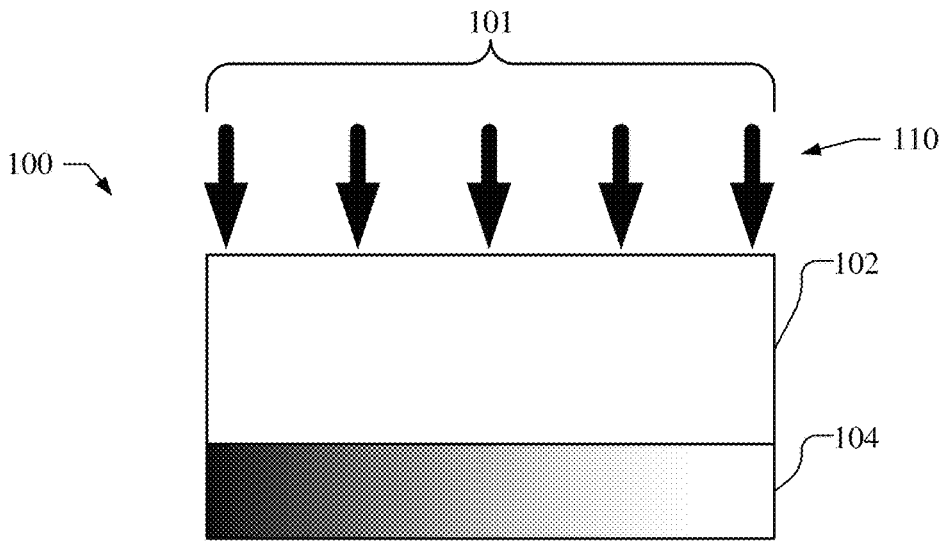
FIG. 1 illustrates a side view of one example of a region-of-interest (ROI) of a sample that includes an SOI that has a known structure with little or no variation across the ROI and a section having an unknown structure that varies across the ROI.

During fabrication of semiconductor and similar devices it is sometimes necessary to monitor the fabrication process by non-destructively measuring the devices. Optical metrology may be employed for non-contact evaluation of samples during processing. Optical metrology techniques, such as thin film metrology and Optical Critical Dimension (OCD) metrology, may use modeling of the structure to generate predicted data that is to be compared with the measured data from the sample. Variable parameters in the model, such as layer thicknesses, line widths, space widths, sidewall angles, etc., may be adjusted varied and the predicted data is generated for each variation. The measured data may be compared with the predicted data for each parameter variation, e.g., in a nonlinear regression process, until a good fit is achieved, at which time the values of the fitted parameters are determined to be an accurate representation of the parameters of the sample.

Conventionally, modeling requires that preliminary structural and material information is known about the sample in order to generate an accurate representative model of the sample, which may include one or more variable parameters. For example, the preliminary structural and material information for a sample may include a physical description of the sample with nominal values for various parameters, such as layer thicknesses, line widths, space widths, sidewall angles, etc., along with a range within which these parameters may vary. The sample may further include one or parameters that are not variable, i.e., are not expected to change in a significant amount during manufacturing. If the structure and/or materials of the structure is unknown, i.e., the preliminary structural and material information is unknown or unavailable, an accurate model cannot be generated for the structure.

Additionally, modeling using techniques such as Rigorous Coupled Wave Analysis (RCWA) requires that the modeled structure is periodic. The use of RCWA in a modeling engine is desirable because it is fast and efficient, but is accompanied with the requirement that the structure is periodic. Accordingly, modeling techniques that require periodicity, such as RCWA, are conventionally unsuitable for non-periodic structures. Other modeling techniques that do not require periodicity, such as Finite-Difference Time-Domain (FDTD) or Finite Element Method (FEM), may be used with aperiodic structures, but these techniques require detailed knowledge of the structure to generate a rigorous model of the entire structure, as well as nanometer-level positioning during measurement to ensure that the measured area matches the modeled area.

Accordingly, if a sample includes nuisance features, e.g., features for which the structural (or material) information is unknown and/or if the structure is non-periodic, optical metrology using modeling may not be possible. By way of example, a sample may include an SOI, which can be modeled, that is optically coupled to a section of the sample with an unknown structure, e.g., preliminary structural and material information is unknown or unavailable, which may sometimes be referred to herein as the "unknown structure" or "nuisance feature." The unknown structure may be periodic, but in some cases may be non-periodic. The SOI, for example, may be on the upper layer(s) of the sample, while the unknown structure may be on lower layer(s) which underlie the SOI. In other examples, the unknown structure may be above the SOI or to the side of the SOI, or may be combined with the SOI, e.g., on the same layer and intermixed with the SOI. During optical measurement of the sample, light that is returned from the unknown structure may be coupled to light that is returned from the SOI in a complicated manner that may be difficult to decouple. Moreover, the unknown structure cannot be rigorously modeled due, e.g., to its unknown structure and possibly its non-periodicity, and accordingly, a rigorous model for the combined SOI and unknown structure cannot be built. Consequently, the use of conventional optical metrology techniques for such a sample is challenging because the predicted data for the sample cannot be generated from a rigorous model to fit to the measured data.

As discussed herein, optical metrology of a sample that includes a SOI and an unknown section may be performed with a trained neural network that determines a first set of parameter values characterizing the SOI and a second set of parameter values characterizing the unknown structure using detected light produced by the target structure in response to incident illumination. In some implementations, the trained neural network, which may be, e.g., a Domain Adversarial Neural Network (DANN) or a multi-target Deep Neural Network (DNN), may be trained with parameters characterizing the SOI and parameters characterizing the unknown structure have an orthogonality of more than 70%. The incident illumination may include a plurality of wavelengths, and the detected light used by the trained neural network may include a subset of the wavelengths, which may be continuous or discrete wavelengths.

FIG. 1 illustrates a side view of one example of a region-of-interest (ROI) 101 of a sample 100 that includes an SOI 102 that has a known structure and an unknown structure section, sometimes referred to as unknown structure 104. FIG. 1 illustrates the SOI 102 as overlying the unknown structure 104, but in some implementations, the unknown structure 104 may overlie the SOI 102 or may be to the side of the SOI 102 (e.g., on the same layer(s)) or may be combined or intermixed with the SOI 102.

The SOI 102 has a known structure, i.e., nominal structural and material information for the SOI 102 is available. Accordingly, the SOI 102 may be rigorously modeled using RCWA (for a periodic structure) or using FDTD or FEM (for a non-periodic structure). The unknown structure 104, on the other hand, has an unknown structure, i.e., preliminary structural and material information is unknown or unavailable. The unknown structure 104 may be non-periodic over the ROI 101. Moreover, as illustrated with the variation in shading of the unknown structure 104, the unknown structure 104 may vary within the ROI 101. Consequently, as discussed above, rigorous modeling of the unknown structure 104 is not possible.

By way of example, in some implementations, the SOI 102 may be a repetitive structures such as Vertical NAND (V-NAND) or Dynamic Random-Access Memory (DRAM) structures and the unknown structure 104 may be a circuit, such as a complementary metal-oxide-semiconductor (CMOS) circuit, or some other underlaying (overlying) circuit, which is sometimes referred to as CMOS-under-Array (CuA), Periphery-Under-Cell (PUC), or Cell-On-Periphery (COP). The preliminary structural and material information for the unknown structure 104 is unknown or unavailable and the unknown structure 104 may include non-periodic structures rendering OCD modeling of the unknown structure 104 not possible.

The unknown structure 104, alternatively, may be structures containing complex regions that were produced in earlier fabrication process steps, while the SOI 102 is in current fabrication process step. For example, a pre-layer structure (e.g., logic such as gate all around (GAA) or DRAM) that may be modeled by OCD modeling, but pre-layer parameters may have a spectral response that are difficult to de-couple from key parameters of current layers. In some implementations, the unknown structure 104 may be periodic and may have the same (or different) periodicity as the SOI 102, but the unknown structure 104 may have a different sensitivity to optical metrology than the SOI 102, e.g., different sensitive wavelength regions, different spectral sensitivity signatures, etc., rendering modeling of the unknown structure 104 not possible.

Accordingly, during optical measurement of the sample 100 with incident light 110, the light returned by the sample over the ROI 101 in response to incident light 110 will include light that is returned from the SOI 102 combined with light returned from the unknown structure 104. Accordingly, the use of conventional OCD modeling of the sample 100, which includes the SOI 102 and the unknown structure 104 is not possible.

Figure 2:
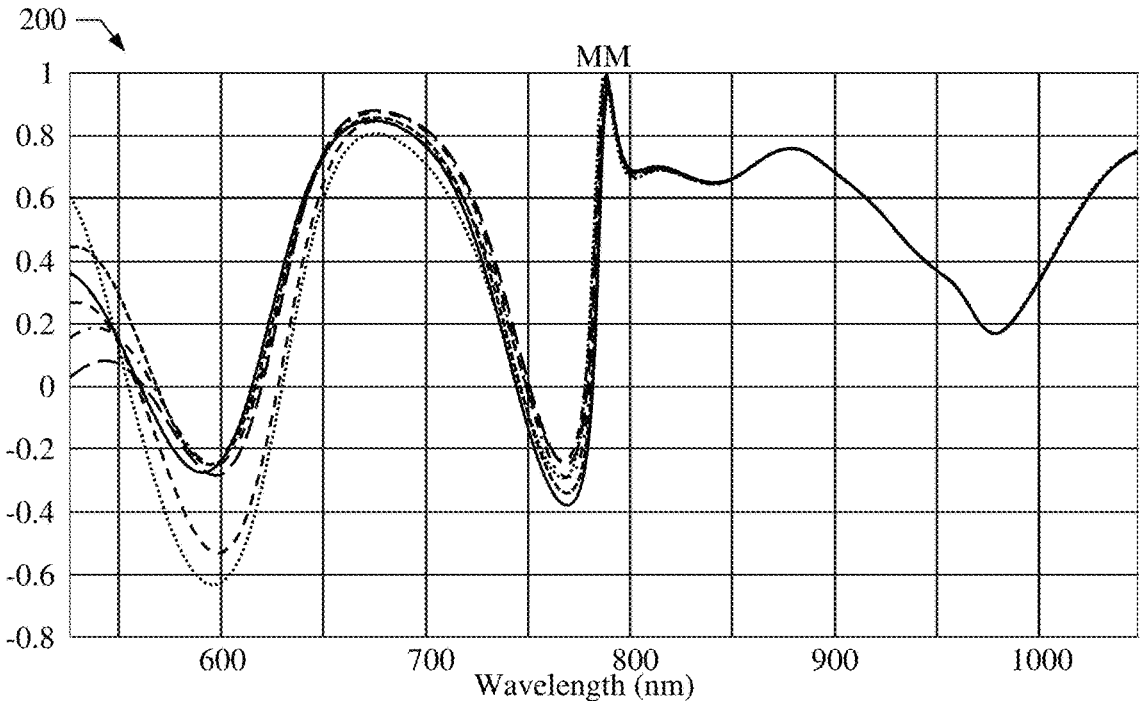
FIG. 2 is a graph illustrating examples of the data that may be collected from a plurality of locations on the ROI shown in FIG. 1.

FIG. 2, by way of example, is a graph 200 illustrating examples of the data that may be collected from a sample 100 shown in FIG. 1. The data in graph 200, for example, illustrates spectral data for a Mueller matrix (MM) element between approximately 530 nm and 1050 nm Each curve illustrated in FIG. 2 represents the MM spectral data for one measurement location on the sample 100 (e.g., corresponding to incident light 110 on sample 100 shown as arrows in FIG. 1). As can be seen, over the same ROI 101 of the sample 100, the collected spectra may have a large variation from location to location, particularly in the shorter wavelength range, e.g., between 530 nm and 780 nm. As discussed above, there is little or no variation in the SOI 102 across the ROI 101, while the unknown structure 104 varies across the ROI 101, and accordingly, variation in the collected data from location to location within the ROI 101 is primarily due to the variation in the unknown structure 104 within the ROI 101. While a single MM element is illustrated in FIG. 2, it should be understood that other MM elements and other types of metrology data, such as ellipsometric data including Psi & Delta data, Jones matrix, partial or full Mueller matrix, etc., reflectometric data including reflectance collected at different polarizer angles and/or different angles of incidence (AOIs), interferometric data including spectra in frequency domain, Fourier-Transform Infrared Spectroscopy (FTIR) data, etc., may have a similarly large variation over the ROI 101.

From the spectra illustrated in graph 200, it can be seen one method to measure the SOI 102 is to truncate the collected spectra. For example, as noted above, the collected spectra have a large variation in the shorter wavelength range, e.g., between 530 nm and 780 nm Thus, by truncating the spectra at approximately 780 nm, in this particular example, the longer wavelengths, which are relatively insensitive to the unknown structure 104, conventional OCD modeling may be used to generate measurements of the SOI 102. Truncation of the spectra, however, eliminates a substantial portion of the data and will limit the accuracy of the measurements.

Another approach may be to use principal component analysis (PCA). For example, a number of samples may be measured and used to determine the main PCA components that are due to variation in the unknown structure 104. These main PCA components may then be subtracted from measured spectra from a sample under test, and a conventional OCD modeling process may be used to generate measurements of the SOI 102 on the sample under test. While the subtraction of the main PCA components creates spectra that will not have a strong dependence on the unknown structure

104, it may leave spectra with possible strong dependence on the unknown structure 104 that was not in the domain of the unknown structures of the samples used to generate the PCA components.

Accordingly, in some implementations, as discussed herein, a trained neural network may be used to predict a first set of parameter values characterizing the SOI 102 and a second set of parameter values characterizing the unknown structure 104 based on optical metrology data obtained from a sample under test that includes the SOI 102 and unknown structure 104. The optical metrology data, for example, may be obtained using illumination radiation (light) that is incident on the target structure on the sample, including the SOI 102 and unknown structure 104 and detecting the radiation from the target structure produced in response to the illumination radiation. The optical metrology data may be obtained from the detected radiation, and may be, e.g., ellipsometric data, reflectometric data, interferometric data, Fourier-Transform Infrared Spectroscopy (FTIR) data, or any combination thereof. As discussed above, due to the optical coupling of the SOI 102 and unknown structure 104, the optical metrology data is combination of contributions from the SOI 102 and contributions from the unknown structure 104. The neural network is trained to predict parameter values characterizing the SOI 102 and parameter values characterizing the unknown structure 104. The neural network, for example, may trained to predict parameters characterizing the SOI 102 and parameters characterizing the unknown structure 104 having an orthogonality of more than 70% of the two predictions.

The trained neural network, for example, may be a Domain Adversarial Neural Network (DANN) or a multi-target Deep Neural Network (DNN), which may be used with unsupervised clustering to define classes to define the space of the unknown structure 104.

Figure 3:
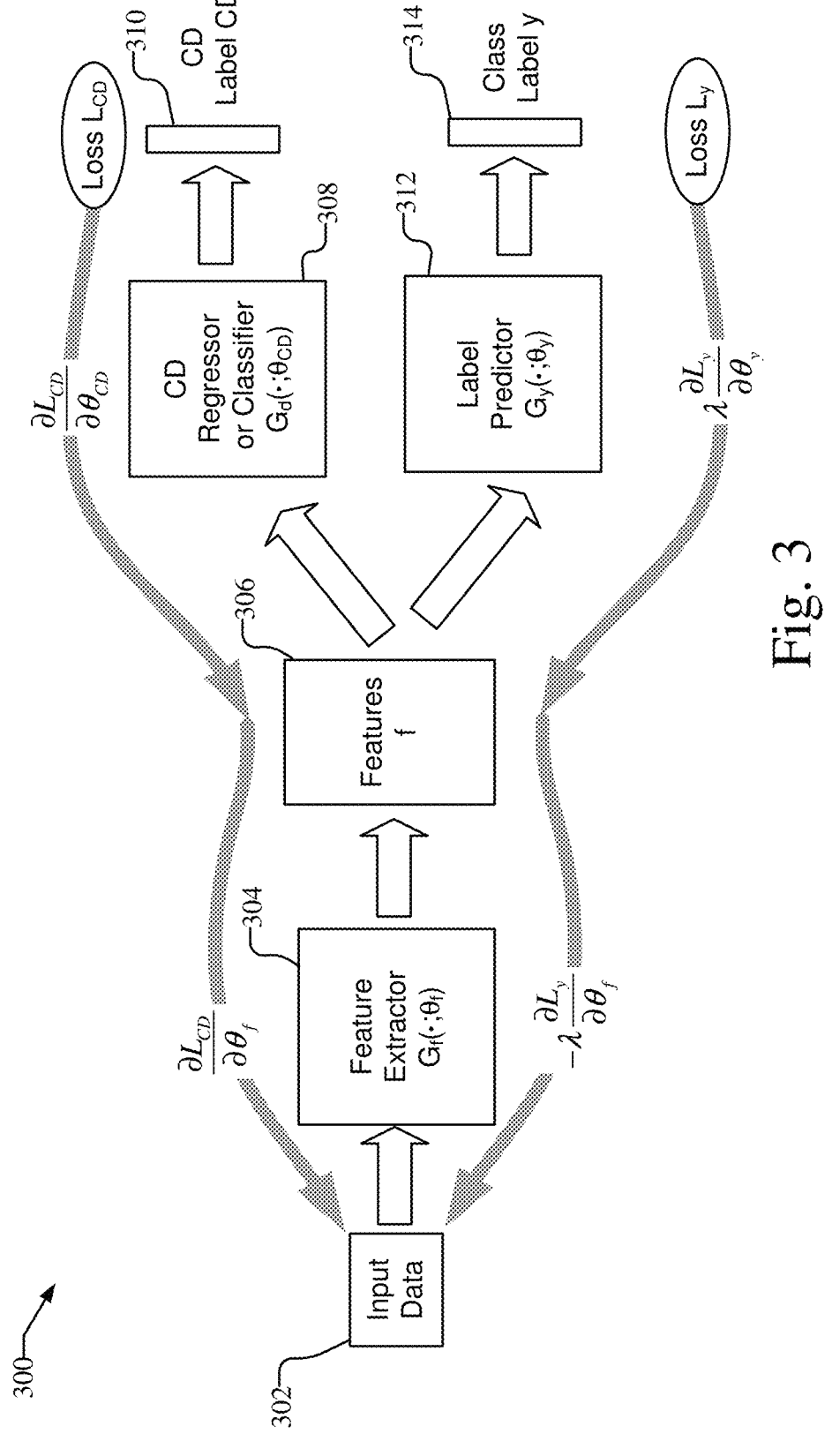
FIG. 3 illustrates an architecture of a Domain Adversarial Neural Network (DANN).

FIG. 3, by way of example, illustrates an architecture of an example of a neural network 300 that may be trained and used to measure a target structure that includes an SOI 102 and an unknown structure 104. The neural network 300 shown in FIG. 3 is a DANN, but other neural networks, such as a multi-target DNN may be trained and used to measure a target structure that includes an SOI 102 and an unknown structure 104.

In neural network 300, input data 302 (e.g., spectra or input features, such as principal components (PCs)) are provided to a deep feature extractor 304, where $G_f(\bullet;\theta_f)$ represents the D-dimensional neural network feature extractor with parameters $\theta_f$. The deep feature extractor 304 generates features f 306 that are fed forward to a critical dimension regressor or classifier 308, where $G_d(\bullet;\theta_{CD})$ represents the computed CD prediction output, with parameters $\theta_{CD}$. The critical dimension regressor or classifier 308 generates CD label CD 310. Additionally, the features f 306 are fed forward to a deep label predictor 312, where $G_y(\bullet;\theta_y)$ represents the computed label prediction output layer, with parameters $\theta_y$. The deep label predictor 312 generates class label y 314. In some implementations, a domain classifier may be used in place of the class label classifier 314. The architecture of neural network 300 includes a gradient reversal layer, illustrated with gray arrows.

The input data with variation in the unknown structure is different the labeled data (e.g., with the SOI CD label). Accordingly, a total batch may be generated with an equal combination of both the unknown structure data with cluster labels and the labeled data. The weight for labeled data may be set to be 0 for the unknown structure class loss and the weight for the unknown structure data with cluster labels may be set to be 0 for the CD target loss. The total batch size may be set to be small (8-20) if there is a small amount of labeled data available. With a small batch size, a stochastic gradient descent and a small learning rate may be used. Additionally, with a small batch size, Dropout may be used instead of Batch Normalization. As an activation function, a standard Rectified Linear Unit (ReLU) may be used, e.g., with a Sigmoid function for the unknown structure classifier. With the standard ReLU activation function, HE initialization may be used.

In some implementations, PCA may be used with the input spectra. For example, PCA may be used with a portion of the data provided for training, such as the full set (or a portion) of data provided with variation in the unknown structure, but not with the SOI CD labeled data. The use of PCA reduces the neural network's ability to provide mitigation to the impacts of unknown structures, but increases the ability of the neural network with adversarial training to be successfully trained off of a small available training sample. In some implementations, PCA may not be used and the spectra may be applied directly with the 2 layer neural network with adversarial training.

In some implementations, the unknown structure targets may be defined. For example, defining unknown structure targets may be done using a clustering algorithm, such as Gaussian Mixture Expectation Maximization (EM). Either soft labels or hard labels may be produced.

Training of the neural network may use a plurality of samples, e.g., multiple measurements from different sites on the same target structure, from different target structures on the same wafer (e.g., on different die), from target structures on different wafers, or any combination thereof. The training samples may include spectra from target structures with variation in the underlying structure, which is unknown structure 104, or with no variation in the underlying structure, which is unknown structure 104 but variation in the SOI. In some implementation, the spectra may contain little or no SOI information as the target, rather than the cluster labels (hard or soft) to define the unknown structure space. For example, this may be done by measurement of the test structure sites before the etching or other process used to produce the SOI.

Thus, training the neural network using losses defined from both the unknown structure space and the SOI space, an orthogonal representation of the features from the unknown structure and the SOI may be produced.

The neural network may be used with spectra below 780 nm (in the example illustrated in FIG. 2) as well as the full range of spectra with the success. Thus, the neural network may be with the full spectra measured by the metrology device, or with a subset of wavelengths. Moreover, the neural network may be used with discontinuous portions or discrete wavelengths in the full spectra, e.g., including longer wavelengths, e.g., wavelengths greater than 780 nm (in the example illustrated in FIG. 2), as well as shorter wavelengths, e.g., wavelengths less than 780 nm, which are conventionally unsuitable for OCD, as discussed in reference to FIG. 2.

Figure 4:
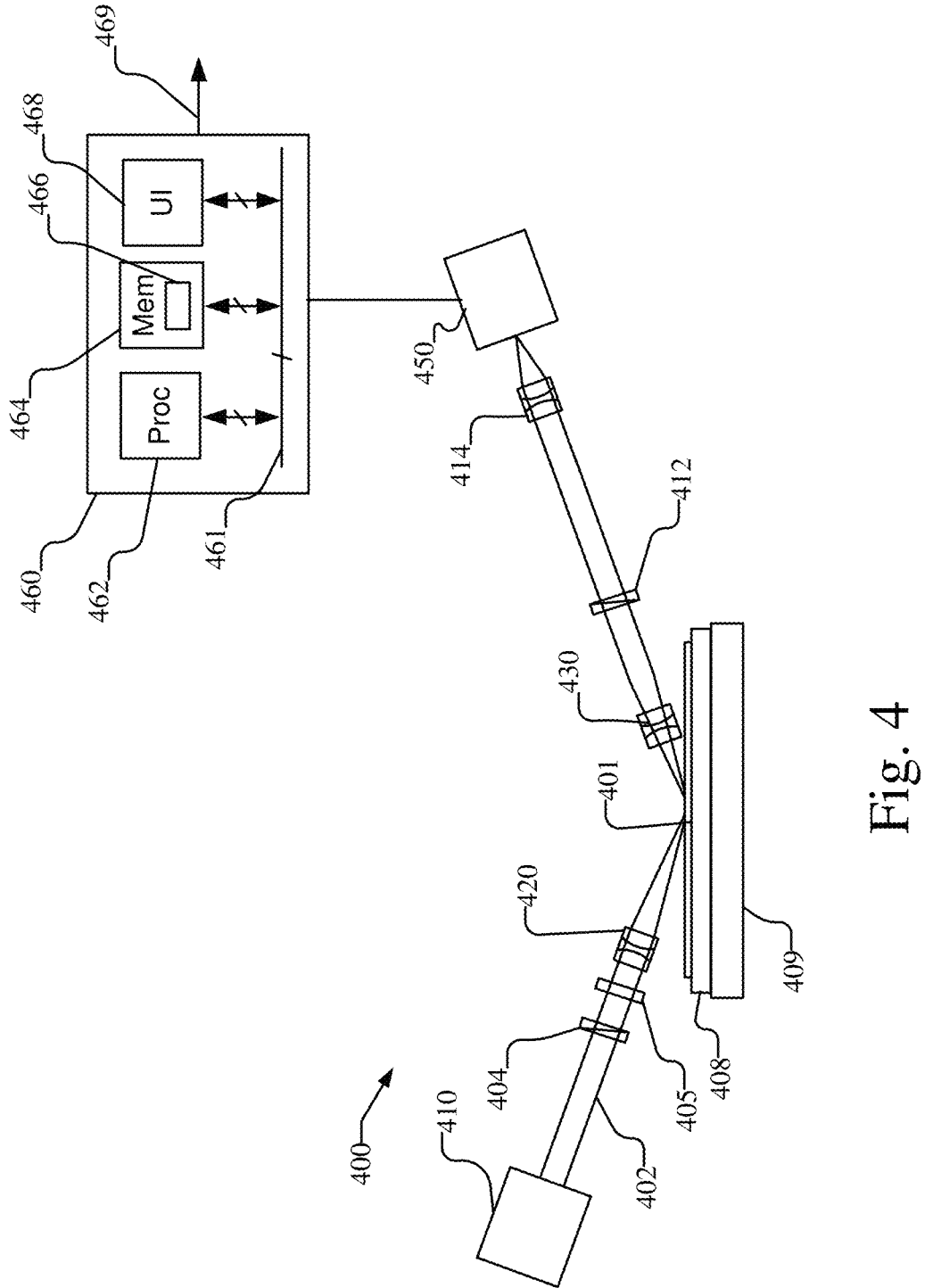
FIG. 4 illustrates a schematic view of an optical metrology device that may be used to measure a target structure including an SOI and unknown structuring using a trained neural network.

FIG. 4, by way of example, illustrates a schematic view of an optical metrology device 400 that may be used to generate metrology data from a test sample and to determining parameter values characterizing the SOI predicted by a trained neural network using the metrology data, as described herein. The optical metrology device 400 may be configured to perform, e.g., spectroscopic reflectometry, spectroscopic ellipsometry (including Mueller matrix ellipsometry), spectroscopic scatterometry, overlay scatterometry, interferometry, or FTIR measurements, of a sample 401 that includes a SOI 102 having a known structure and a section having an unknown structure 104 that is optically coupled to the SOI, e.g., as discussed in reference to FIG. 1. It should be understood that optical metrology device 400 is illustrated as one example of a metrology device, and that if desired other metrology devices may be used, including normal incidence devices, non-polarizing devices, etc.

Optical metrology device 400 includes a light source 410 that produces light 402. The light 402, for example, UV-visible light with wavelengths, e.g., between 200 nm and 1000 nm. The light 402 produced by light source 410 may include a range of wavelengths, i.e., continuous range or a plurality of discrete wavelengths, or may be a single wavelength. The optical metrology device 400 includes focusing optics 420 and 430 that focus and receive the light and direct the light to be obliquely incident on a top surface of the sample 401. The optics 420, 430 may be refractive, reflective, or a combination thereof and may be an objective lens.

The reflected light may be focused by lens 414 and received by a detector 450. The detector 450, may be a conventional charge coupled device (CCD), photodiode array, CMOS, or similar type of detector. The detector 450 may be, e.g., a spectrometer if broadband light is used, and detector 450 may generate a spectral signal as a function of wavelength. A spectrometer may be used to disperse the full spectrum of the received light into spectral components across an array of detector pixels. One or more polarizing elements may be in the beam path of the optical metrology device 400. For example, optical metrology device 400 may include one or both (or none) of a polarizing element 404 in the beam path before the sample 401, and a polarizing element (analyzer) 412 in the beam path after the sample 401, and may include one or more additional elements, such as a compensator or photoelastic modulator 405, which may be before, after, or both before and after the sample 401.

Optical metrology device 400 further includes one or more computing systems 460 that is configured to perform measurements of one or more parameters of the sample 401 using the methods described herein. The one or more computing systems 460 is coupled to the detector 450 to receive the metrology data acquired by the detector 450 during measurement of the structure of the sample 401. The one or more computing systems 460, for example, may be a workstation, a personal computer, central processing unit or other adequate computer system, or multiple systems. The one or more computing systems 460 may be configured to utilize the trained neural network, e.g., as described herein, to predict a set of parameter values characterizing the SOI and a set of parameter values characterizing the unknown structure based on the metrology data, in accordance with the methods described herein.

It should be understood that the one or more computing systems 460 may be a single computer system or multiple separate or linked computer systems, which may be interchangeably referred to herein as computing system 460, at least one computing system 460, one or more computing systems 460. The computing system 460 may be included in or is connected to or otherwise associated with optical metrology device 400. Different subsystems of the optical metrology device 400 may each include a computing system that is configured for carrying out steps associated with the associated subsystem. The computing system 460, for example, may control the positioning of the sample 401, e.g., by controlling movement of a stage 409 that is coupled to the chuck. The stage 409, for example, may be capable of horizontal motion in either Cartesian (i.e., X and Y) coordinates, or Polar (i.e., R and θ) coordinates or some combination of the two. The stage may also be capable of vertical motion along the Z coordinate. The computing system 460 may further control the operation of the chuck 408 to hold or release the sample 401. The computing system 460 may further control or monitor the rotation of one or more polarizing elements 404, 412, or compensator/photoelastic modulator 405, etc.

The computing system 460 may be communicatively coupled to the detector 450 in any manner known in the art. For example, the one or more computing systems 460 may be coupled to a separate computing systems that is associated with the detector 450. The computing system 460 may be configured to receive and/or acquire metrology data or information from one or more subsystems of the optical metrology device 400, e.g., the detector 450, as well as controllers polarizing elements 404, 412, 405, etc., by a transmission medium that may include wireline and/or wireless portions. The transmission medium, thus, may serve as a data link between the computing system 460 and other subsystems of the optical metrology device 400.

The computing system 460, which includes at least one processor 462 with memory 464, as well as a user interface (UI) 468, which are communicatively coupled via a bus 461. The memory 464 or other non-transitory computer-usable storage medium, includes computer-readable program code 466 embodied thereof and may be used by the computing system 460 for causing the at least one computing system 460 to control the optical metrology device 400 and to perform the functions including the analysis described herein. The data structures and software code for automatically implementing one or more acts described in this detailed description can be implemented by one of ordinary skill in the art in light of the present disclosure and stored, e.g., on a computer-usable storage medium, e.g., memory 464, which may be any device or medium that can store code and/or data for use by a computer system, such as the computing system 460. The computer-usable storage medium may be, but is not limited to, include read-only memory, a random access memory, magnetic and optical storage devices such as disk drives, magnetic tape, etc. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

The computing system 460 may obtain and analyze the data acquired from the detector 450. The computing system 460, for example, may be used to acquire metrology data using the optical metrology device 400 from a number of training (source) samples, which may be used to train the neural network to predict parameter values characterizing the SOI 102 and parameter values characterizing the unknown structure 104 as discussed herein. For example, the trained neural network may be trained to predict parameters characterizing the SOI 102 and parameters characterizing the unknown structure 104 with an orthogonality of at least 70%. In some implementations, a different computing system and/or different optical metrology device may be used to acquire the metrology data from training (source) samples that is used to train the neural network, and the resulting training neural network may be provided to the computing system 460, e.g., via the computer-readable program code 466 on non-transitory computer-usable storage medium, such as memory 464.

The computing system 460 may be used to acquire metrology data using the optical metrology device 400 from the test (target) sample. The metrology data is the same type used to train the neural network and the test (target) sample has the same structure, e.g., with the SOI 102 and unknown structure 104, as the training (source) samples. The computing system 460 may determine a first set of parameter values characterizing the SOI 102 and a second set of parameter values characterizing the unknown structure 104 as predicted by the trained neural network using the obtained metrology data from the test (target) sample. The metrology data used to determine the parameters values of the SOI and unknown structure, for example, may include the full range of wavelengths received by the detector 450 or may include a subset of wavelengths, which may be one or more continuous ranges or discrete wavelengths.

The results from the analysis of the data may be reported, e.g., stored in memory 464 associated with the sample 401 and/or indicated to a user via UE 468, an alarm or other output device. Moreover, the results from the analysis may be reported and fed forward or back to the process equipment to adjust the appropriate fabrication steps to compensate for any detected variances in the fabrication process. The computing system 460, for example, may include a communication port 469 that may be any type of communication connection, such as to the internet or any other computer network. The communication port 469 may be used to receive instructions that are used to program the computing system 460 to perform any one or more of the functions described herein and/or to export signals, e.g., with measurement results and/or instructions, to another system, such as external process tools, in a feed forward or feedback process in order to adjust a process parameter associated with a fabrication process step of the samples based on the measurement results.

FIG. 5 illustrates a process of optical measuring a sample using an optical metrology device, such as optical metrology device 400 shown in FIG. 4.

As illustrated at block 502, the optical metrology device generates illumination light that is incident on a target structure on the sample, the target structure comprising a structure-of-interest (SOI) having a set of known parameters and an unknown structure that has unknown parameters, e.g., as illustrated in FIG. 1. As discussed above, the unknown structure may reside at a region that underlies the SOI, is on top of the SOI, is beside the SOI, or is coincident or interweaved with the SOI. The illumination light, for example, may be generated using light source 410, shown in FIG. 4, which may produce light with one or more wavelengths, including range of wavelengths, i.e., continuous range or a plurality of discrete wavelengths. The incident light may be polarized, e.g., by polarizing elements 404 and 405 shown in FIG. 4, or unpolarized.

At block 504, the optical metrology device detects light from the target structure produced in response to the illumination light that is incident on the target structure. For example, the detector 450, shown in FIG. 4, may detect the light from the target structure in response to the incident light. The detected light, for example, may be spectral data.

At block 506, the optical metrology device obtains metrology data from the detected light, wherein the metrology data is a combination of a first contribution from the SOI and a second contribution from the unknown structure. By way of example, the computing system 460, shown in FIG. 4, may determine metrology data based on the detected light received from the detector 450, e.g., such as the Mueller matrix spectral data 200 shown in FIG. 2. For example, the metrology data obtained by the computing system based on the detected light may be ellipsometric data (e.g., including Mueller matrix data), reflectometric data, interferometric data, FTIR data, etc. or any combination thereof.

At block 508, the optical metrology device determines a first set of parameter values characterizing the SOI and a second set of parameter values characterizing the unknown structure as predicted by a trained neural network using the metrology data. By way of example, the computing system 460, shown in FIG. 4, may determine the parameter values characterizing the SOI and the parameter values characterizing the unknown structure as predicted by a trained neural network, e.g., as discussed in reference to FIG. 3 and FIG. 4. The trained neural network, for example, may be a DANN or a multi-target DNN, as discussed herein.

In some implementations, the parameters characterizing the SOI and parameters characterizing the unknown structure in the trained neural network are orthogonal, e.g., with an orthogonality of more than 70%, to the maximum orthogonality as limited by the neural network training.

In the present description, features are generally used to describe the data, even if features are often the terms given to the representation of data before it becomes the target that is desired, however, the targets are also features for another analysis agent. In a PCA transformation, the various PCs are defined by orthogonal unit vectors. These define a basis and thus a vector space. The orthogonality between two sets of feature within some data may be tested by performing a PCA transformation of the data. Recall that Principal Components are the eigenvectors of the data's covariance matrix. It is desired to determine the property of some function $f(x_n)$ $=\{y_i, y_j\}$ where $y_i$ are targets that are desired and $y_j$ are a parameterization of the nuisance, i.e., the unknown structure. The general supervised training task finds $f(x_n)=\{y_i\}$. The parameterization, $y_j$, may be done in many ways, such as to take some unlabeled data where the unknown structure features are known to vary strongly but the target features are known to not vary minimally. The unknown structure features may be labeled or unlabeled. Considering the case where the unknown structure features are unlabeled, $x_n$ for this data, which may be denoted as $x_n{}^s$, and can be used to define a vector space, where the most important eigenvectors (or Primary Components) describe the unknown structure features and not the target features. A clustering analysis (Expectation Maximization) may be used to define soft labels for a classifier or the eigenvectors from $x_n{}^s$, or some other representation of the unknown structure features, which may be labeled as $y_j$. There is no requirement that $y_j$ and $y_i$ are in the same basis and in general they will not be the same basis. Considering the concatenation of $\{y_i, y_j\}$ and comparing it to the that of $y_j$ (or $y_i$), however may provide a measure of orthogonality. For example, a PCA transformation may be performed on both $\{y_i, y_j\}$ and $y_j$ giving $v_{j+i}$ and $u_j$. Then the orthogonality L may be found as L=Min $(v_l \cdot u_l)$ where l is some set of size i in j+i. In the limit of infinite data, where $y_j$ and $y_i$ are independent, L=0. In real situations, however, the condition for orthogonality is L<ε where ε should be estimated from the task and data, which may server as an orthogonality metric. It may be possible to consider the eigenvalues instead of the eigenvectors, since often the system does not have degeneracy.

The optical metrology device may additionally communicate the first set of parameter values characterizing the SOI to a semiconductor process tool to adjust process parameters of the semiconductor process tool. For example, the computing system 460, shown in FIG. 4, may feed forward or feedback the measurement results via communication port

469, to another system, such as external process tools to adjust process parameters associated with fabrication process step of the samples based on the measurement results.

In some implementations, the illumination light may include a plurality of wavelengths. Additionally, the metrology data obtained from the detected light may be obtained using a subset of wavelengths from the plurality of wavelengths. For example, in some implementations, the subset of wavelengths may include discrete wavelengths.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of optical measurement of a sample, the method comprising:

generating illumination light that is incident on a target structure on the sample, the target structure nominally comprising a combination of a structure-of-interest (SOI) and an unknown structure, the SOI having a set of known parameters comprising nominal structural and material information and the unknown structure having unknown parameters comprising at least one of unknown structural information and unknown material information;

detecting light from the target structure produced in response to the illumination light that is incident on the target structure;

obtaining metrology data from the detected light, wherein the metrology data is a combination of a first contribution from the SOI and a second contribution from the unknown structure; and determining values for the set of known parameters characterizing the SOI as predicted by a trained neural network using the metrology data.

2. The method of claim 1, wherein parameters characterizing the SOI and parameters characterizing the unknown structure have an orthogonality of more than 70%.

3. The method of claim 1, wherein the trained neural network is one of a Domain Adversarial Neural Network and a multi-target Deep Neural Network.

4. The method of claim 1, further comprising communicating the values for the set of known parameters characterizing the SOI to a semiconductor process tool to adjust process parameters of the semiconductor process tool.

5. The method of claim 1, wherein the unknown structure resides at a region that underlies the SOI, is on top of the SOI, is beside the SOI, or is coincident with the SOI.

6. The method of claim 1, wherein the metrology data comprises at least one of ellipsometric data, reflectometric data, interferometric data, Fourier-Transform Infrared Spectroscopy (FTIR) data, or a combination thereof.

7. The method of claim 1, wherein the illumination light comprises a plurality of wavelengths.

8. The method of claim 7, wherein the metrology data obtained from the detected light is obtained using a subset of wavelengths from the plurality of wavelengths.

9. The method of claim 8, wherein the subset of wavelengths comprises discrete wavelengths.

10. An optical metrology device configured for optical measurement of a sample, the optical metrology device comprising:

a light source configured to generate light to be incident on a target structure on the sample, the target structure nominally comprising a combination of a structure-of-interest (SOI) and an unknown structure, the SOI having a set of known parameters comprising nominal structural and material information and the unknown structure having unknown parameters comprising at least one of unknown structural information and unknown material information;

at least one detector configured to detect light from the target structure produced in response to the light that is incident on the target structure; and at least one processor coupled to the at least one detector, wherein the at least one processor is configured to:

obtain metrology data from the detected light, wherein the metrology data is a combination of a first contribution from the SOI and a second contribution from the unknown structure; and determine values for the set of known parameters characterizing the SOI as predicted by a trained neural network using the metrology data.

11. The optical metrology device of claim 10, wherein parameters characterizing the SOI and parameters characterizing the unknown structure have an orthogonality of more than 70%.

12. The optical metrology device of claim 10, wherein the trained neural network is one of a Domain Adversarial Neural Network and a multi-target Deep Neural Network.

13. The optical metrology device of claim 10, wherein the at least one processor is further configured to communicate the values for the first set of known parameters characterizing the SOI to a semiconductor process tool to adjust process parameters of the semiconductor process tool.

14. The optical metrology device of claim 10, wherein the unknown structure resides at a region that underlies the SOI, is on top of the SOI, is beside the SOI, or is coincident with the SOI.

15. The optical metrology device of claim 10, wherein metrology data comprises at least one of ellipsometric data, reflectometric data, interferometric data, Fourier-Transform Infrared Spectroscopy (FTIR) data, or a combination thereof.

16. The optical metrology device of claim 10, wherein the light comprises a plurality of wavelengths.

17. The optical metrology device of claim 16, wherein the metrology data obtained from the detected light is obtained using a subset of wavelengths from the plurality of wavelengths.

18. The optical metrology device of claim 17, wherein the subset of wavelengths comprises discrete wavelengths.

19. An optical metrology device configured for optical measurement of a sample, the optical metrology device comprising:

a light source configured to generate light to be incident on a target structure on the sample, the target structure nominally comprising a combination of a structure-of-interest (SOI) and an unknown structure, the SOI having a set of known parameters comprising nominal structural and material information and the unknown structure having unknown parameters comprising at least one of unknown structural information and unknown material information;

a detector configured to detect light from the target structure produced in response to the light that is incident on the target structure;

a means for obtaining metrology data from the detected light, wherein the metrology data is a combination of a first contribution from the SOI and a second contribution from the unknown structure; and a means for determining values for the set of known parameters characterizing the SOI as predicted by a trained neural network using the metrology data.

20. The optical metrology device of claim 19, wherein parameters characterizing the SOI and parameters characterizing the unknown structure have an orthogonality of more than 70%.

21. The optical metrology device of claim 19, wherein the light comprises a plurality of wavelengths and wherein the metrology data obtained from the detected light is obtained using a subset of wavelengths from the plurality of wavelengths.

22. The optical metrology device of claim 21, wherein the subset of wavelengths comprises discrete wavelengths.

* * * * *